US010607851B2

United States Patent
Li et al.

(10) Patent No.: US 10,607,851 B2
(45) Date of Patent: Mar. 31, 2020

(54) VAPOR-ETCH CYCLIC PROCESS

(71) Applicant: Micron Technology, Inc., Boise, ID (US)

(72) Inventors: Andrew L. Li, Boise, ID (US); Prashant Raghu, Boise, ID (US); Sanjeev Sapra, Boise, ID (US); Rita J. Klein, Boise, ID (US); Sanh D. Tang, Boise, ID (US); Sourabh Dhir, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/686,526

(22) Filed: Aug. 25, 2017

(65) Prior Publication Data

US 2019/0067028 A1 Feb. 28, 2019

(51) Int. Cl.

| H01L 21/00 | (2006.01) |
|---|---|
| H01L 21/311 | (2006.01) |
| H01L 21/02 | (2006.01) |
| H01L 27/108 | (2006.01) |
| H01L 21/66 | (2006.01) |
| H01L 21/67 | (2006.01) |
| H01L 29/423 | (2006.01) |
| H01L 29/786 | (2006.01) |
| H01L 29/66 | (2006.01) |

(52) U.S. Cl.
CPC .... *H01L 21/31116* (2013.01); *H01L 21/0206* (2013.01); *H01L 21/67017* (2013.01); *H01L 22/20* (2013.01); *H01L 29/42392* (2013.01); *H01L 29/66772* (2013.01); *H01L 29/78696* (2013.01); *H01L 22/26* (2013.01); *H01L 27/10873* (2013.01)

(58) Field of Classification Search
None
See application file for complete search history.

(56) References Cited

U.S. PATENT DOCUMENTS

| 5,635,102 A | 6/1997 | Mehta |
| 6,951,821 B2 | 10/2005 | Hamelin et al. |
| 7,416,989 B1 * | 8/2008 | Liu ............... H01L 21/02063 438/706 |
| 7,877,161 B2 | 1/2011 | Tomoyasu et al. |

(Continued)

*Primary Examiner* — Angel Roman
(74) *Attorney, Agent, or Firm* — Schwegman Lundberg & Woessner, P.A.

(57) ABSTRACT

Various embodiments comprise methods of selectively etching oxides over nitrides in a vapor-etch cyclic process. In one embodiment, the method includes, in a first portion of the vapor-etch cyclic process, exposing a substrate having oxide features and nitride features formed thereon to selected etchants in a vapor-phase chamber; transferring the substrate to a post-etch heat treatment chamber; and heating the substrate to remove etchant reaction products from the substrate. In a second portion of the vapor-etch cyclic process, the method continues with transferring the substrate from the post-etch heat treatment chamber to the vapor-phase chamber; exposing the substrate to the selected etchants in the vapor-phase chamber; transferring the substrate to the post-etch heat treatment chamber; and heating the substrate to remove additional etchant reaction products from the substrate. Apparatuses for performing the method and additional methods are also disclosed.

26 Claims, 13 Drawing Sheets

(56) References Cited

U.S. PATENT DOCUMENTS

| | | | |
|---|---|---|---|
| 8,175,736 | B2 | 5/2012 | Tomoyasu et al. |
| 8,252,194 | B2 | 8/2012 | Kiehlbauch et al. |
| 8,617,348 | B1* | 12/2013 | Liu ................... H01L 21/0206 |
| | | | 156/345.27 |
| 9,384,993 | B2 | 7/2016 | Suemasa |
| 2004/0185583 | A1* | 9/2004 | Tomoyasu .......... C23C 16/4405 |
| | | | 438/8 |
| 2004/0185670 | A1 | 9/2004 | Hamelin et al. |
| 2008/0311687 | A1* | 12/2008 | Yamashita ........ H01L 21/32137 |
| | | | 438/9 |
| 2008/0311688 | A1* | 12/2008 | Yamashita .......... G06F 17/5036 |
| | | | 438/14 |
| 2009/0275205 | A1 | 11/2009 | Kiehlbauch et al. |
| 2011/0061810 | A1 | 3/2011 | Ganguly et al. |
| 2014/0197493 | A1 | 7/2014 | Tsai et al. |
| 2017/0117118 | A1* | 4/2017 | Toh .................... H01J 37/3244 |
| 2018/0090315 | A1* | 3/2018 | Bi .................... H01L 21/02334 |

* cited by examiner

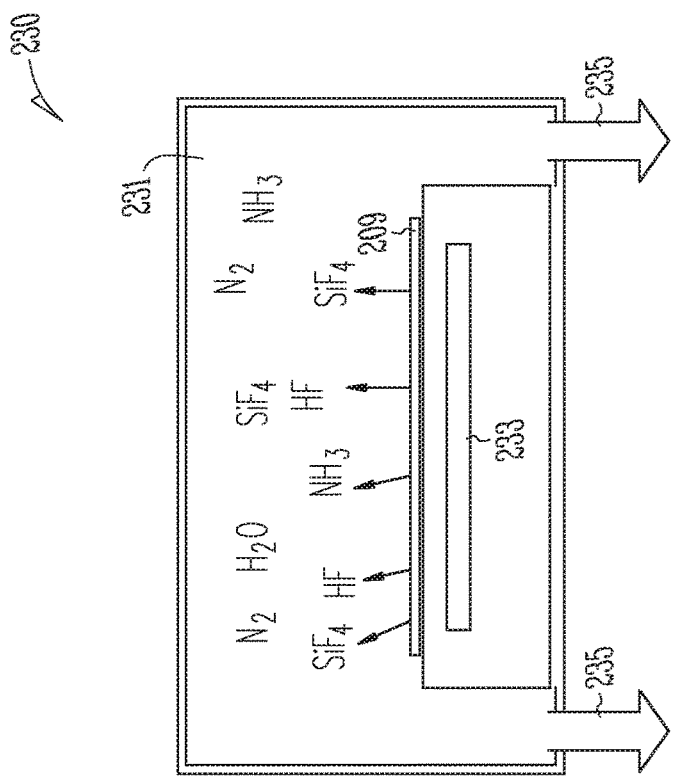
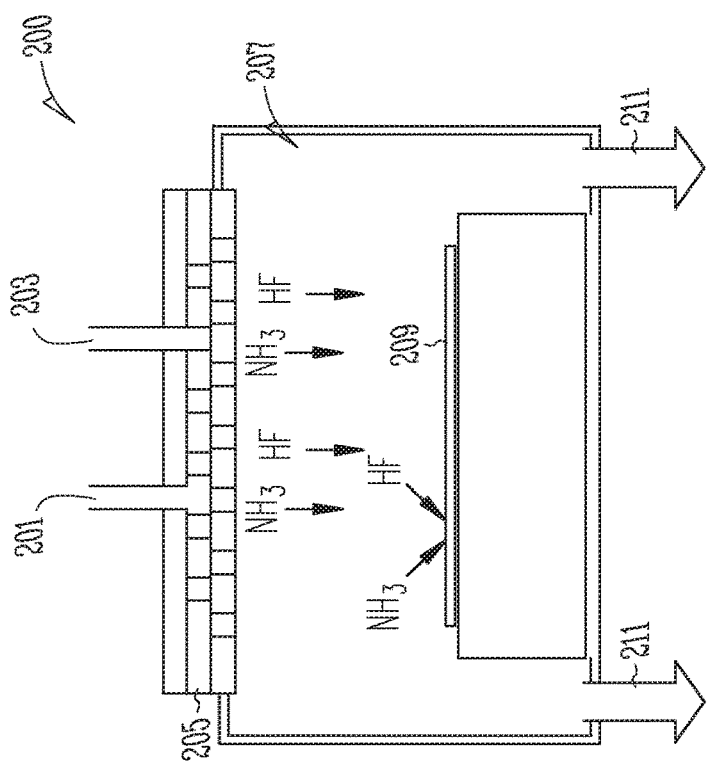
Fig. 2A
Fig. 2B

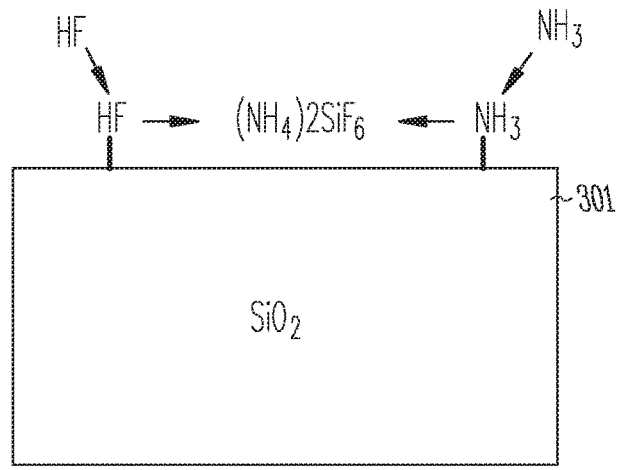
*Fig. 3A*
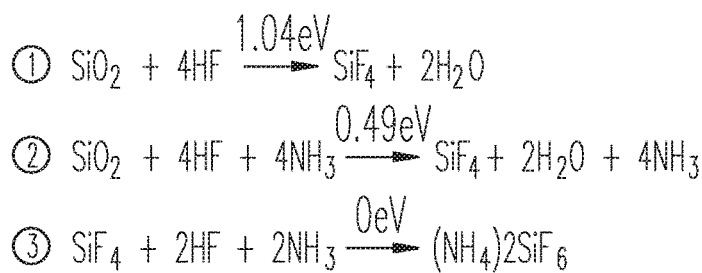
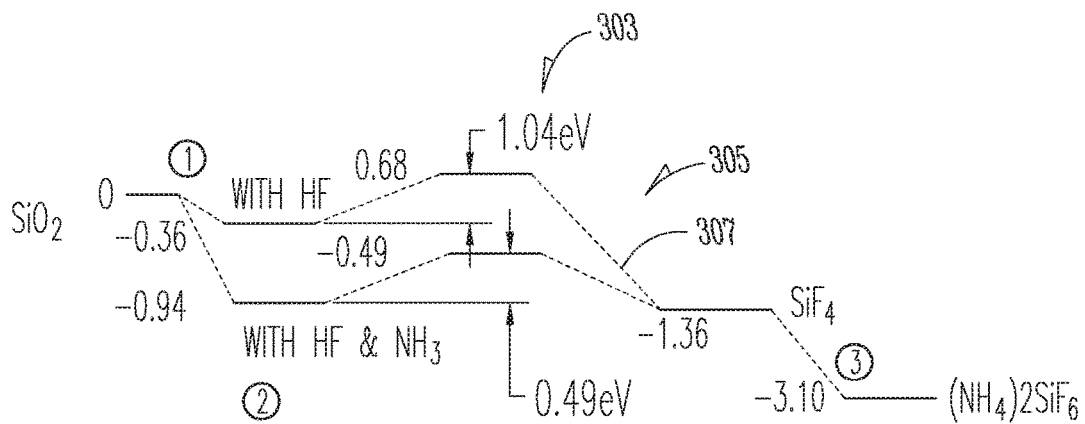
*Fig. 3B*

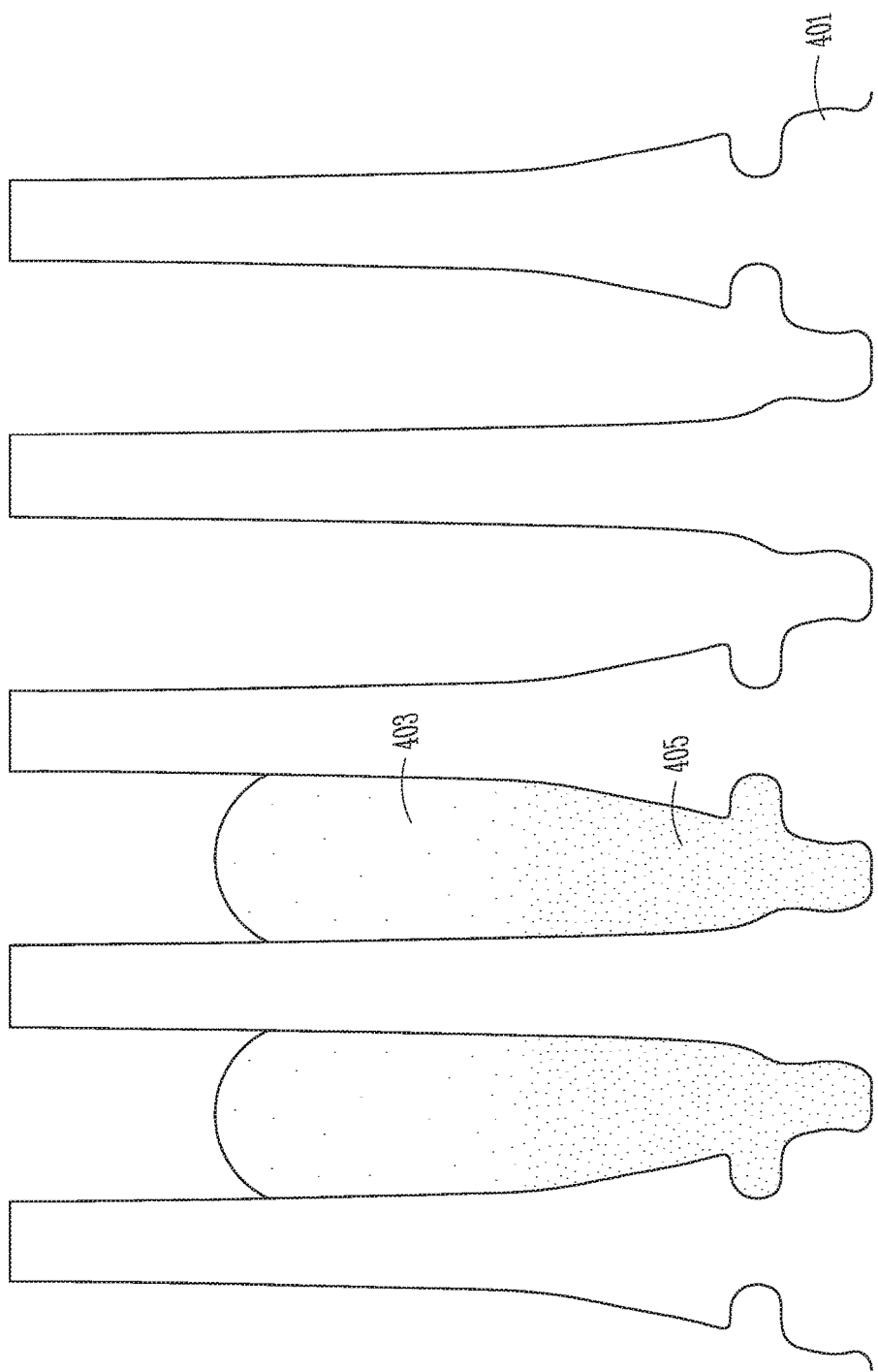

VAPOR-ETCH CYCLIC PROCESS

BACKGROUND

Contemporary DRAM-based memory devices have become increasingly dense as the desire for more memory storage increases. Opening cell contacts in the devices has been a challenge in DRAM functionality. With each successive generation, the "open challenge" increases as design rules shrink.

By recessing an oxide (e.g., $SiO_x$) of a recessed-access device (RAD) formed over active area (AA) silicon, more surface area for polysilicon deposition is exposed and better contact is achieved. However, traditional wet-fluorinated chemistries do not have a sufficiently high-level of oxide-over-nitride selectivity that is needed. Historically, the surface cleanliness of a silicon wafer could be achieved by using hydrofluoric (HF) acid (aqueous based) or buffered HF-solutions (e.g., buffered oxide-etch (BOE) chemistry types). These wet chemistries leave a hydrogen-bonded surface that is stable at room temperature, but only for a short period-of-time. During the short time period, a good silicon-to-silicon interface is possible. However, HF-based chemicals do not have the required selectivities with regard to silicon nitride isolation structures (for example, a silicon nitride layer that may surround a digit line in a memory device, such as DRAM memory). Selectivities of greater than 50:1 (oxide-to-nitride) are desired to keep the nitride layer intact. Otherwise, the electrical performance of the device is negatively impacted. Typically, oxide-to-nitride selectivity ratios for contemporary HF-based chemicals range from 10:1 to 40:1 depending on concentration, additives, and temperature. Therefore, alternative process methods are necessary for good cell contact Formation. Further, although various vapor-etch processes have been developed, contemporary processes are still incapable of oxide-to-nitride selectivity ratios of greater than 50:1 as is needed.

BRIEF DESCRIPTION OF DRAWINGS

Various ones of the appended drawings merely illustrate exemplary embodiments of the present invention and cannot be considered as limiting its scope.

FIG. 2A shows an exemplary embodiment of a chemical oxide-removal (COR) device;

FIG. 2B shows a post-etch heat treatment (PHI) device;

FIG. 3A shows a reaction of $NH_3$ and HF gas adsorbed onto a silicon dioxide ($SiO_2$) surface of an $SiO_2$ feature;

FIG. 3B shows an energy diagram for various combinations of reactant gases with $SiO_2$;

FIG. 4 shows a cross-section 401 of a portion of a DRAM device near a cell contact area;

DETAILED DESCRIPTION

As disclosed herein, a vapor-etch cyclic process was developed. The vapor-etch cyclic process consists of two-portions. In an example DRAM process, a first portion of the vapor-etch cyclic process etches an oxide, such as RAD oxide with high selectivity to nitride by exposing a substrate to hydrogen fluoride (HF) plus ammonia ($NH_3$) reactant gases; and in a second portion of the vapor-etch cyclic process, removing resulting reaction products and other by-products produced from the process of the first portion. The vapor-etch cyclic process is repeated iteratively between the first portion and the second portion until oxide removal targets are met. The vapor-etch cyclic process is a highly selective process and is a key enabler to form the necessary oxide recess to help mitigate cell contact issues. Further, this highly selective process facilitates forming contacts at advanced process nodes and design rules not feasible with conventional wet processing operations. As discussed below, in observed sample processes utilizing wet processing, cell contact opens are contemporaneously at a 100% failure rate. In various experiments, the failure rate was reduced to 20%, or less, with the vapor-etch cyclic process disclosed herein. The vapor-etch cyclic process will be described herein in the context of recessing a contact opening in a RAD DRAM structure. However, as will be apparent to persons skilled in the art having the benefit of this disclosure, the described process may be utilized in forming other types of memory devices and forming other types of semiconductor devices in which improved etch selectivity of oxide relative to nitride is beneficial.

Figures 1A, 1B:
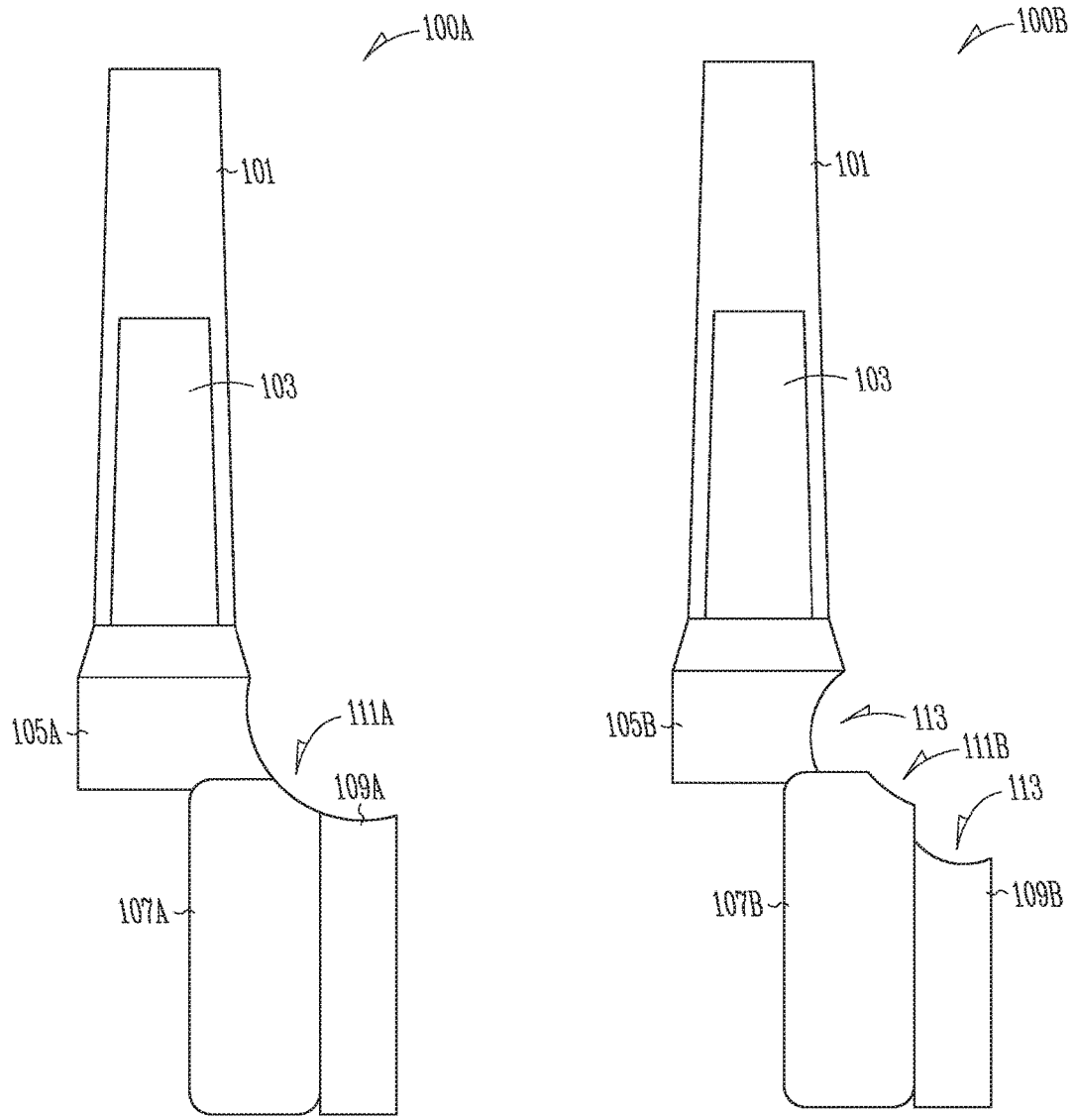
FIG. 1A shows an enlarged view of an exemplary cell contact area of a memory device as etched by various types of wet-etch and plasma-etch processes of the prior art.
FIG. 1B shows an enlarged view of an exemplary cell contact area of a memory device as etched by the vapor-etch cyclic process of the disclosed subject matter.

With reference now to FIG. 1A, an enlarged view of an exemplary cell contact area 100A of a memory device as etched by various types of wet-etch and plasma-etch processes of the prior art is shown. The cell contact area 100A is shown to include a conductive line 103 encapsulated by a spacer nitride 101. The conductive line 103 and the spacer nitride 101 are formed over a first oxide 105A. In a specific exemplary embodiment, the first oxide 105A may be a dense tetraethyl orthosilicate (TEOS) or other type of oxide known to a person of ordinary skill in the art of semiconductor fabrication. The first oxide 105A, in turn, was previously formed over active area (AA) silicon 107A and a second oxide 109A. In a specific exemplary embodiment, the second oxide 109A is a dense spin-on dielectric (SOD) 109A.

As further shown in FIG. 1A, only a relatively small area 111A of the AA silicon 107A is exposed. A skilled artisan will recognize that additional etching will expose more of the AA silicon 107A. However, the increased etching will also reduce a size of the spacer nitride 101 surrounding and insulating conductive line 103. In extreme cases, the AA silicon 107A will not be sufficiently exposed for subsequent processes. Subsequent processes of formation of additional cell contacts (not shown) in DRAM manufacturing require deposition of polysilicon onto the AA silicon 107A. Forming a low-resistance contact area requires a larger portion of the AA silicon 107A to be exposed. Additional problems that can occur with extended etching as practiced in the prior art are discussed below.

For example, contact failures are usually associated with high resistance at later-formed polysilicon-to-AA silicon interfaces. The high resistance is due, at least in part, to various oxide layers (e.g., a RAD oxide layer and a native oxide layer) that remain on the AA. The oxide layers need to be removed due to, for example, spatial restrictions for the cell contact structure. Therefore, one goal of increased-density memory devices is to effectively remove oxide layers with sufficient selectivity to other exposed materials, such as silicon nitride. A specific goal in the specific application of RAD device etching is to increase the surface area of the AA available for contacting subsequently-deposited polysilicon.

Referring now to FIG. 1B, an enlarged view of an exemplary cell contact area 100B of a memory device as etched by the vapor-etch cyclic process disclosed herein is shown. In comparison with FIG. 1A, FIG. 1B shows a significantly increased etching 113 of both the first oxide 105B and the second oxide 109B. The increased etching produces an undercut of the first oxide 105B below the conductive line 103 and the spacer nitride 101. However, as also noted in FIG. 1B, there is little to no noticeable reduction in the nitride spacer 101. Since the vapor-etch cyclic process has a much higher selectivity ratio (oxide-to-nitride), oxides etch much more rapidly than nitrides. The observed undercut is due to the isotropic nature of the vapor-etch cyclic process, as described in more detail below.

Due to the increased etching of the first oxide 105B and the second oxide 109B, a larger area 111B of AA silicon 107B is exposed compared with the small area 111A of the AA silicon 107A of FIG. 1A. The increased exposed area allows for both an increase in the percentage of AA silicon areas exposed as well as an increase in AA silicon contact area for later deposition of polysilicon to form, for example, digit lines.

Further, as discussed below in more detail, there are a variety of other oxide types to which the vapor-etch cyclic process may be applied. The oxide-to-nitride selectivity ratio is largely independent of oxide type.

FIG. 2A depicts an example embodiment of a chemical oxide-removal (COR) device 200 used with the first phase of the disclosed vapor-etch cyclic process; while FIG. 2B depicts an example embodiment of a post-heating-treatment (PHT) device 230 used with the second phase of the disclosed vapor-etch cyclic process. One example of a suitable process tool for performing the vapor-etch cyclic process is the Certas™ system, manufactured by Tokyo Electron Limited (TEL), Akasaka Biz Tower, 3-1 Akasaka 5-chome, Minato-ku, Tokyo, Japan.

The COR device 200 of FIG. 2A is shown to include a first gas inlet 201, a second gas inlet 203, a gas mixing chamber 205, a vapor-phase chamber 207, and exhaust ports 211. In various embodiments, ammonia gas, $NH_3$, and hydrogen fluoride, HF, reactant gases introduced into the COR device 200 through the first gas inlet 201 and the second gas inlet 203. The two gases are mixed in the gas-mixing chamber 205 prior to entering the vapor-phase chamber 207 as gaseous vapors in a non-plasma-based reaction. The gaseous vapors then interact with the surface of the substrate 209 (e.g., a semiconductor wafer), micro-etching the surface of the substrate 209 as the $NH_3$ and HF gaseous vapors adsorb on the surface of the substrate. Variables such as $NH_3$ and HF partial pressure, dilution gas (e.g., Ar and $N_2$) partial pressure, and overall pressure, contribute to affecting the etch rate and oxide-to-nitride selectivity ratios for various materials.

The substrate 209 is typically heated to within a temperature range of from about 20° C. to about 80° C., although other temperatures and temperature ranges are discussed in more detail below. Controlling or changing the temperature of the substrate 209 allows for additional process control, such as slowing down the etch rate with increasing temperature.

The reaction of the gases with the surface is discussed below with regard to FIGS. 3A and 3B for a substrate 209 in the form of a silicon wafer having, for example, silicon dioxide ($SiO_2$) features formed thereon. Briefly however, the reactant gases, $NH_3$ and HF, react with the $SiO_2$ producing $(NH_4)_2SiF_6$ (ammonium hexafluoro silicate or AFS) as a reaction product. The AFS reaction product is evaporated in a second process step, discussed below, in a post-etch heat treatment. Referring again to FIG. 2A, after the initial process is completed, all or substantially all of the remaining gases and gaseous vapors are pumped out through the exhaust ports 211.

Referring now to FIG. 2B, after the initial etch process that occurred in the COR device 200 is completed, the substrate 209 is transferred to a post-etch heat treatment (PHT) device 230. The PHT device 230 is shown to include a PHT chamber 231, a substrate heater 233, and exhaust ports 235. In one embodiment, heat is applied to the substrate 209 in to heat the substrate 209 to a temperature within a range from about 100° C. to about 200° C. Other temperatures and temperature ranges are discussed below. Heating the substrate 209 produces nitrogen ($N_2$), water ($H_2O$), silicon tetrafluoride ($SiF_4$), and $NH_3$. Each of these molecules is volatile and evaporate from the surface of the substrate 209. Consequently, the PHT device 230 evaporates and removes all or substantially all of the AFS reaction product and other by-products produced from reaction of the substrate 209 with the etchant vapors, $NH_3$ and HF, in the COR device 200.

Although not shown explicitly, the person of ordinary skill in the art will recognize that it may be possible to perform all operations in a single chamber. In this embodiment, the COR device 200 and the PHT device 230 of FIGS. 2A and 2B, respectively, are integrated as a single device. In this exemplary embodiment, the substrate does not transfer from the COR device 200 to the PHT device 230. Instead, the substrate remains on a stage (chuck) in the single, integrated device, Each of the separate process steps described herein with regard to the COR device 200 and the PHT device 230 are performed in the single, integrated device with evacuations of the single chamber as needed between the two portions of the vapor-etch cyclic process.

In various exemplary embodiments, pressure ranges in the COR device 200 can vary from about 20 mT to about 200 mT or higher. The average time of the substrate in the vapor-phase chamber during the first portion of the cycle can vary from about 4 seconds to about 20 seconds or more. A temperature of the stage on which the substrate 209 is placed can vary from about 25° C. to about 45° C. or higher. Gas volumetric flow rates in the COR device 200 can vary from about 30 sccm to about 100 sccm or higher. HF volumetric flows rates can also vary from about 30 sccm to about 100 sccm or higher.

In various exemplary embodiments, pressure ranges in the PHT device 230 can vary from about 100 mT to about 3000 mT or higher. The substrate heater 233 temperature can vary from about 100° C. to about 300° C. or higher. A total time of the substrate 209 in the PHT device 230 can vary from about 30 seconds to about 150 seconds or more.

The person of ordinary skill in the art, upon reading and understanding the disclosure presented herein, will recognize that additional pressures, temperatures, and flows outside of these ranges may be optimal for other types of devices or device configurations and geometries. Based on the disclosure presented, the skilled artisan can tailor these various parameters to find a combination of, for example, temperatures and pressures, that work well for a given device type or structure.

Tables 1A and 1B, below, provide examples of a specific exemplary embodiment in the form of a process recipe.

TABLE 1A

Exemplary Process Recipe for the COR Device 200

| | Time in Step [sec] | | | | | |
|---|---|---|---|---|---|---|
| | 60 | 30 | 10 | 35 | 5 | 20 |
| Chamber Pressure [mT] | 2000 | 2000 | 20 | 20 | 0 | 0 |
| $N_2$ [sccm] | 1500 | 1500 | 0 | 0 | 0 | 0 |
| $NH_3$ [sccm] | 0 | 80 | 80 | 80 | 80 | 0 |
| HF [sccm] | 0 | 0 | 0 | 80 | 0 | 0 |
| Ar [sccm] | 200 | 200 | 68 | 68 | 200 | 0 |

TABLE 1B

Exemplary Process Recipe for the PHT Device 230

| Time in Step [sec] | 5 | 30 | 10 | 30 |
|---|---|---|---|---|
| Chamber Pressure [mT] | 2000 | 2000 | 675 | 0 |
| $N_2$ [sccm] | 2000 | 750 | 750 | 0 |

As indicated with reference now to FIG. 3A, below, when the substrate 209 is a silicon wafer with $SiO_2$ features, various molecules are removed during the heat treatment. The heat treatment releases, for example, silicon tetrafluoride ($SiF_4$), $NH_3$, HF, and $H_2O$ vapor. Each of these molecules, and residual $N_2$, Ar, or other dilution gases, is then either subsequently or continuously evacuated substantially from the PHT chamber 231 through the exhaust ports 235. As described in more detail below, the substrate 209 is then transferred back to the COR device 200 at least once, and, in some embodiments, a number of times, until oxide removal targets are achieved. The number of times the two-part process of the vapor-etch cyclic process is iterated depends on a number of factors, as described below.

FIG. 3A shows a reaction of $NH_3$ and HF gas adsorbed onto an $SiO_2$ surface of an $SiO_2$ feature 301. As shown, after the HF and $NH_3$ molecules are adsorbed to the surface of the $SiO_2$ feature, they react forming $(NH_4)_2SiF_6$ (AFS as indicated above). Note that plasma-phase chemistry is not required for this reaction; therefore, the vapor phase of $NH_3$ and HF gases is sufficient for the reaction to proceed.

FIG. 3B shows an energy diagram for various combinations of reactant gases with $SiO_2$. With concurrent reference to FIG. 3B, a first reaction at "1" considers $SiO_2$ reacting with 4HF. Accordingly, at a transition state 303, and coupled with 1.04 eV activation energy at energy transition 305, the reaction occurs as:

$SiO_2$+4HF (with an activation energy of 1.04 eV)→$SiF_4$+2$H_2O$ (Reaction "1")

A second reaction at "2" considers $SiO_2$ reacting with 4HF and 4$NH_3$, and coupled with 0.49 eV activation energy at energy transition 307, the reaction occurs as:

$SiO_2$+4HF+4$NH_3$ (with an activation energy of 0.49 eV)→$SiF_4$+2$H_2O$+4$NH_3$ (Reaction "2")

Consequently, there is a decreased activation energy with the addition of $NH_3$ of 0.49 eV as compared with the activation energy of 1.04 eV for the first reaction without $NH_3$.

A third reaction at "3" considers the $SiF_4$ formed as part of a reaction product:

$SiF_4$+2HF+2$NH_3$→$(NH_4)_2SiF_6$ (Reaction "3")

However, as noted above, the two-step process is iterated at least once, and possibly a number of times, between the COR device 200 and the PHT device 230 of FIGS. 2A and 2B, respectively. The reason for the iteration can be understood more readily with reference to FIG. 4.

FIG. 4 shows a cross-section 401 of a DRAM device near a cell contact area (see also the description of the cell contact area with reference to FIGS. 1A and 1B, above). Near the lower portion of the cross-section 401, the AFS reaction product 405 (i.e., near the RAD oxide formations of FIGS. 1A and 1B) has effectively blocked additional reactions with the oxides from reactant gases 403. As discussed above, the gases react with the exposed silicon oxide to form the reactant product, $(NH_4)_2SiF_6$, (the AFS reaction product 405). Consequently, due to the presence of the AFS reaction product 405, the reactant gases 403 (e.g., the HF and $NH_3$ vapors) can no longer interact with the various oxides near the bottom of the trench (e.g., near the AA silicon). Therefore, the AFS reaction product 405 must first be removed prior to additional oxide etching occurring. Hence, the iterative process between the COR device 200 and the PHT device 230. The oxides are etched in the COR device 200 until the reaction slows sufficiently (exemplary times are discussed below). Once production of the reaction product has slowed, the substrate 209 is removed from the COR device 200 and transferred to the PHT chamber 230 to remove the AFS. Once the AFS is removed, the substrate 209 is transferred again to the COR device 200 to remove additional oxides. The iterative process continues until an oxide removal target has been reached. The oxide removal target will depend on a number of factors such as thicknesses of various levels of oxide overlaying the AA silicon, design rules of the device (e.g., smaller design rules will limit the oxide etches more quickly than devices with larger design rules, allowing having larger openings, and a number of other factors known to a person of ordinary skill in the art upon reading and understanding the disclosure provided herein).

Figure 5:
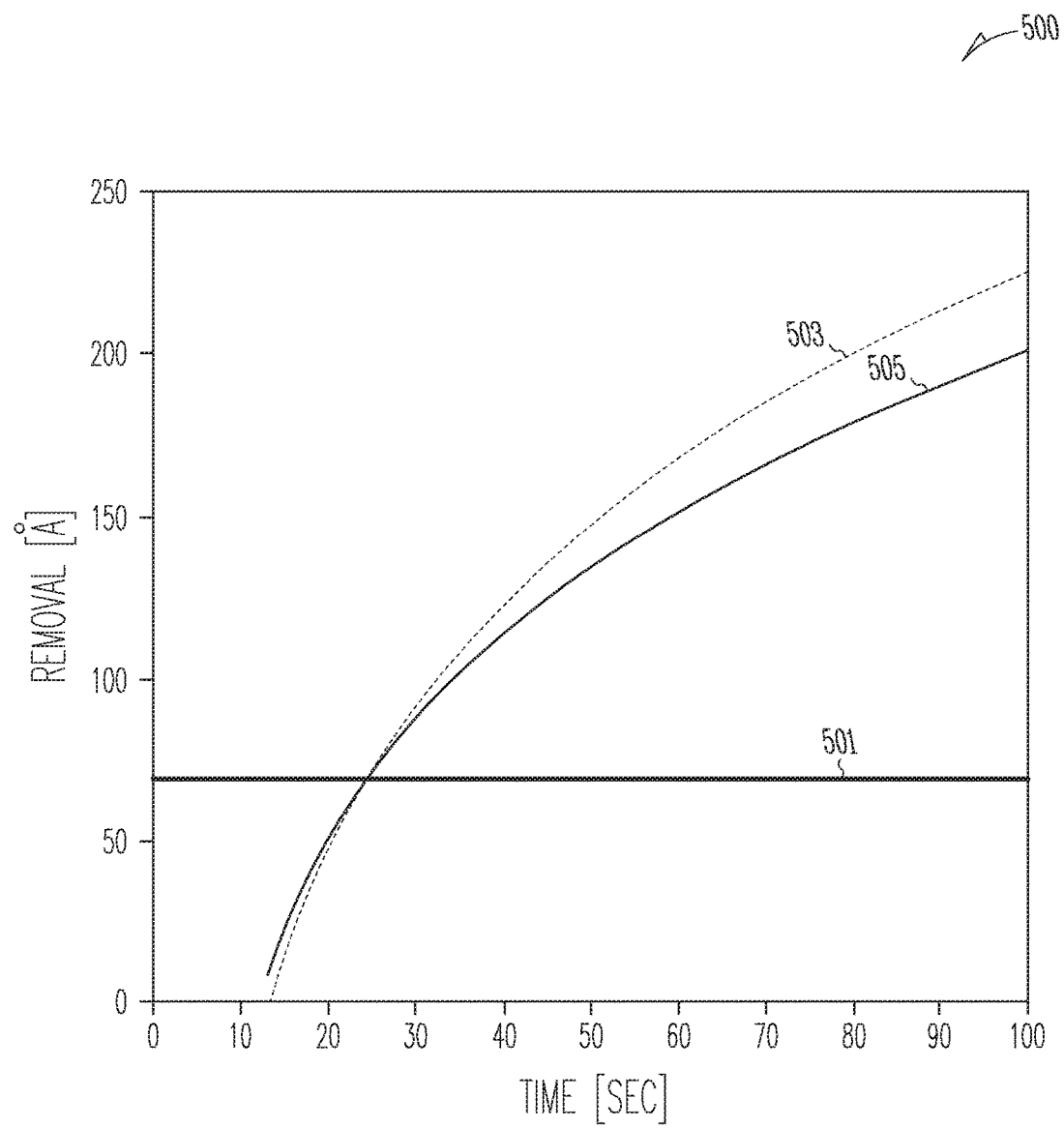
FIG. 5 shows an exemplary calibration curve developed for an etch process in the COR device of FIG. 2A.

FIG. 5 shows an exemplary calibration curve 500 developed for an etch process in the COR device 200 (FIG. 2A) for a pressure of 40 mT at 35° C. The exemplary calibration curve 500 shows oxide removal, in Å, as a function of time. As can be seen graphically and as discussed above with reference to FIG. 4, the oxide removal rate slows as time increases.

With continuing reference to FIG. 5, two different oxide etch curves are shown; a first curve 503 for a first type of oxide and a second curve 505 for a second type of oxide. As indicated by the exemplary calibration curve 500, different types of oxides etch fairly uniformly and consistently with the reactant gases introduced into the COR device 200 (FIG. 2A), particularly within the range of between approximately 15 and 30 seconds of etching. Experimental results have shown close to a 1:1 selectivity ratio between different oxide types (for example, within a range of approximately 0.8:1 to 1.3:1).

The first 503 and second curves 505 are measured and graphed as a step in developing a complete process recipe and compared with an oxide removal target 501. In this exemplary embodiment, the oxide removal target is 70 Å. For example, several curves can be developed at different pressures, temperatures, design rules, and oxide types to determine a desired time in which the substrate 209 is etched in the COR device 200, prior to transfer to the PHT device 230 (see FIG. 2B).

In various experimental trials, researchers discovered, for example, that oxide removal rates increased with an increase in the pressure (e.g., from about 40 mT to about 100 mT) in the vapor-phase chamber 207 of the COR device 200 (FIG. 2A). However, there was a linear increase in the nitride etch rate as well, resulting in a lowered oxide-to-nitride selectivity ratio. Further, removing oxides at a higher rate also produced the reactant product, AFS, at a faster rate as well. Therefore, for a particular DRAM process at a given set of design rules, the highest oxide-to-nitride selectivity ratio, only as a function of pressure (held at a constant temperature) in the vapor-phase chamber 207, was selected to be about 40 mT. However, other device types, design rules, oxide types, etc. will benefit from graphing results for differing chamber pressures.

Figure 6:
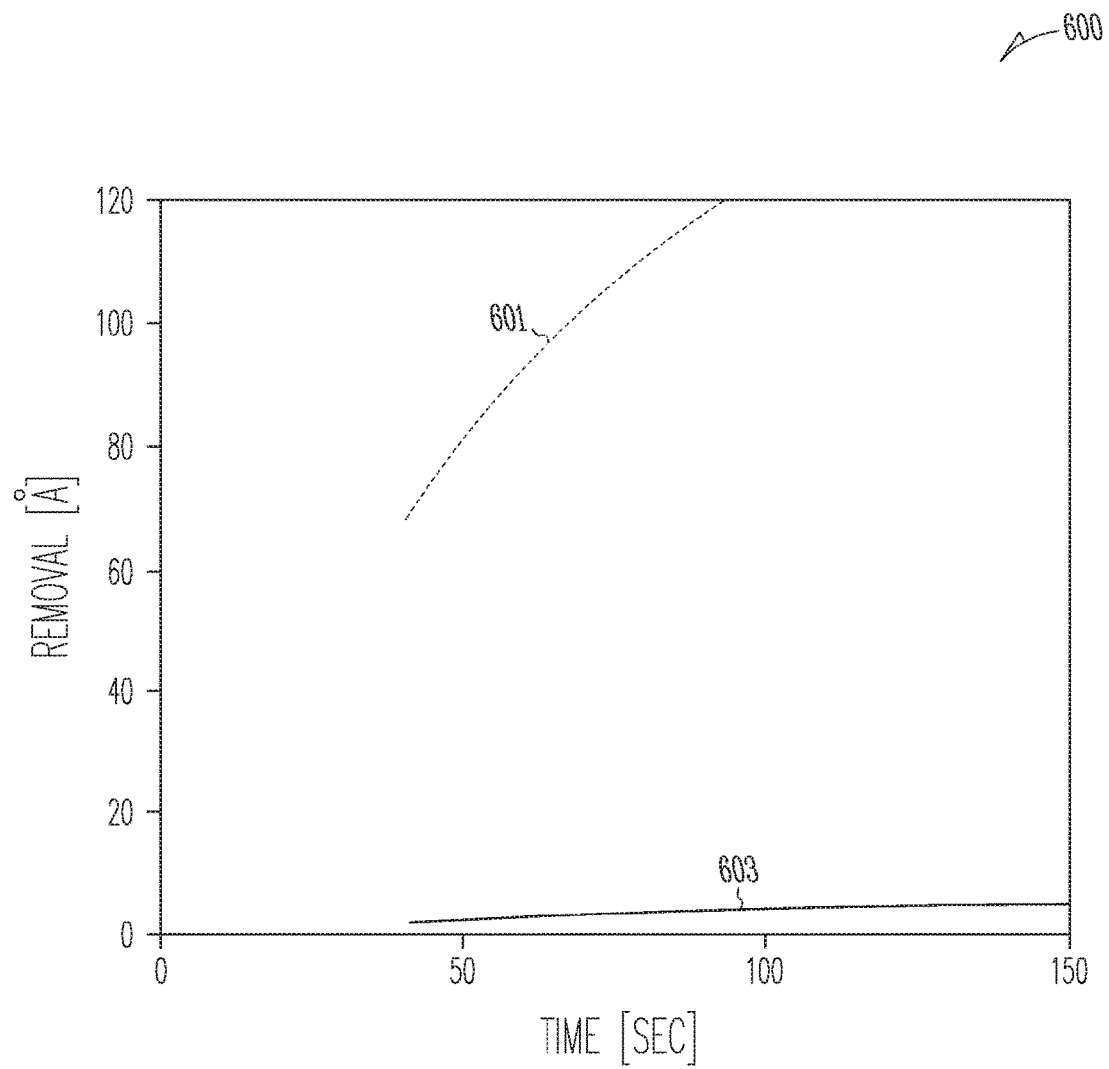
FIG. 6 shows an exemplary oxide-to-nitride selectivity ratio graph for oxide removal and nitride removal as a function of time.

FIG. 6 shows an exemplary oxide-to-nitride selectivity ratio graph 600 for oxide removal (curve 601) and nitride removal (curve 603) as a function of time using the disclosed vapor-etch cyclic process. In various other cases (not shown), selectivity oxide-to-nitride selectivity ratios of greater than about 50:1 have been achieved based on various processing factors such as reactant gas flow rates, etch times, number of iterations between etch and post-etch heat treatment, and other factors discussed herein. Based on results achieved with various combinations of times, temperatures, pressures, cycles (iterations), and so on, the researchers foresee oxide-to-nitride selectivity ratios of up to about 80:1 or greater. In some examples, greater selectivity may come at a cost of a greater number of iterations than would be preferred. In some examples, the researchers have experimented with iterations between the COR device 200 and the PHT device 230 of 2 cycles, 4 cycles, 8 cycles, and 12 cycles and determined oxide-to-nitride selectivity ratios based on the number of iterations in addition to other parameters discussed herein. Critical dimension (CD) measurements also confirmed that oxide removal rates (and oxide-to-nitride selectivity ratios) were increasing measurably with a higher number of cycles. Also, etching along the sidewalls of the AA silicon increased, thereby improving the surface area of the contact. Further, the number of "open" cell contacts significantly improved with increasing cycle numbers providing an indication of more efficient oxide removal and an improved interface between the AA silicon and a subsequent polysilicon deposition.

Additionally, for different processes and semiconductor device types, the amount of undercut desired (see FIG. 1B) may also be a consideration in addition to the exposed amount of the AA silicon.

Figure 7:
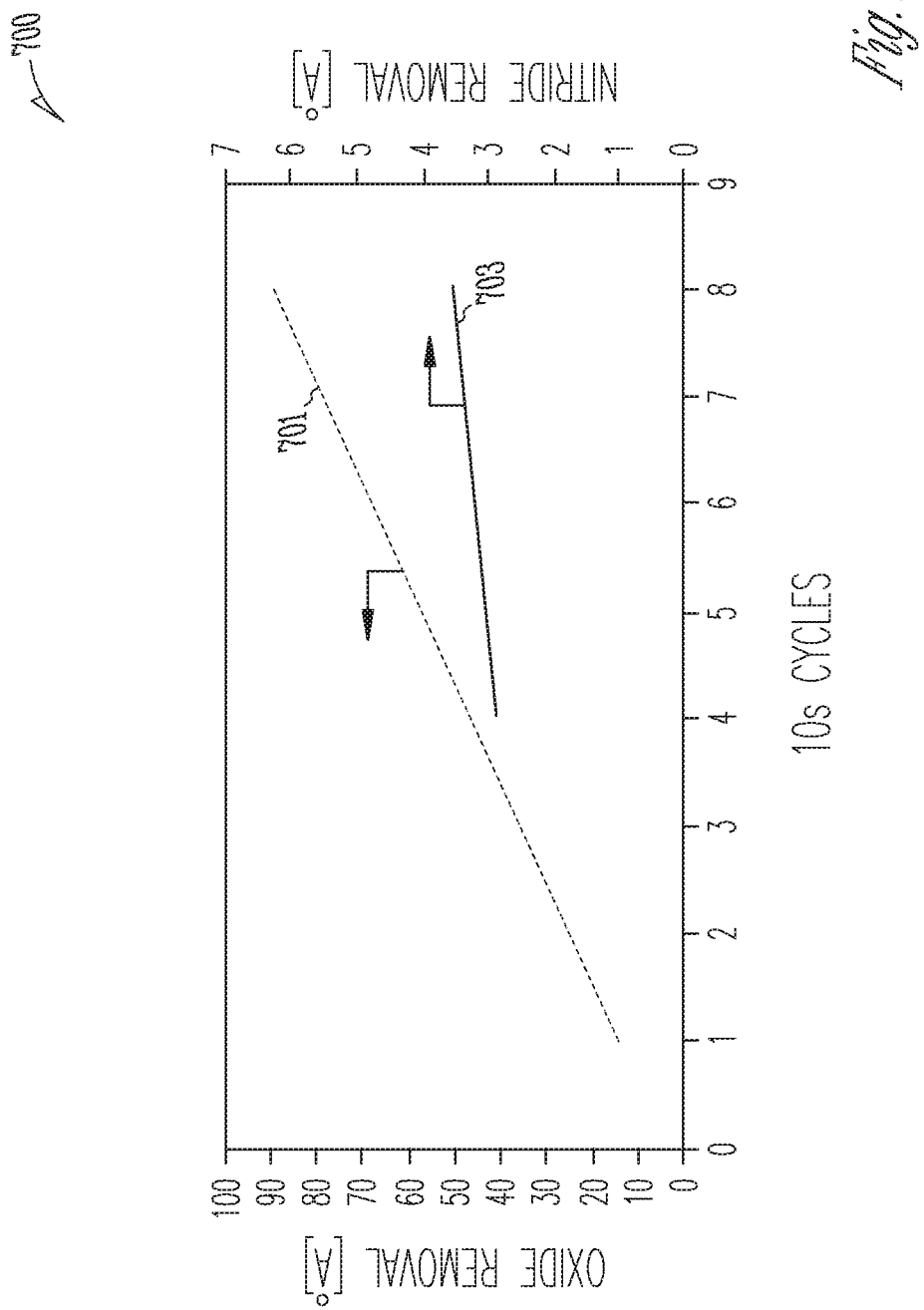
FIG. 7 shows an exemplary oxide-to-nitride selectivity graph showing removal rates, in Å, of oxide and nitride as a function of the number of 10-second cycles (iterations) between the COR device 200 and the PHT device 230 of FIGS. 2A and 2B.

For example, FIG. 7 shows an exemplary oxide-to-nitride selectivity graph 700 showing removal rates, in Å, of oxide (curve 701) and nitride (curve 703) as a function of the number of 10-second cycles (iterations) between the COR device 200 and the PHT device 230 (see FIGS. 2A and 2B). In one example, the researchers obtained an oxide etch of about 10 Å per cycle. Depending on a particular device structure, an oxide etch of about 8 Å per cycle to about 12 Å per cycle may provide a good balance between speed of oxide removal and control of an amount of oxide removed.

Overall, the researchers discovered that the oxide-to-nitride selectivity ratio generally increased with an increase in the number of cycles. Further, the 10 seconds-per-cycle indicated better spacer nitride (e.g., spacer nitride 101 of FIGS. 1A and 1B) preservation than processes performed at 15-seconds per cycle and above. This increased spacer nitride preservation at 10 seconds-per-cycle is likely due to an AFS saturation at the bottom of the contact (see the AFS reaction product 405 of FIG. 4). In the case of longer times-per-cycle, reactants are still present above the AFS reaction product 405 and alongside of the spacer nitride 101, allowing etching of the nitride to continue without further etching of the oxides.

Figure 8A:
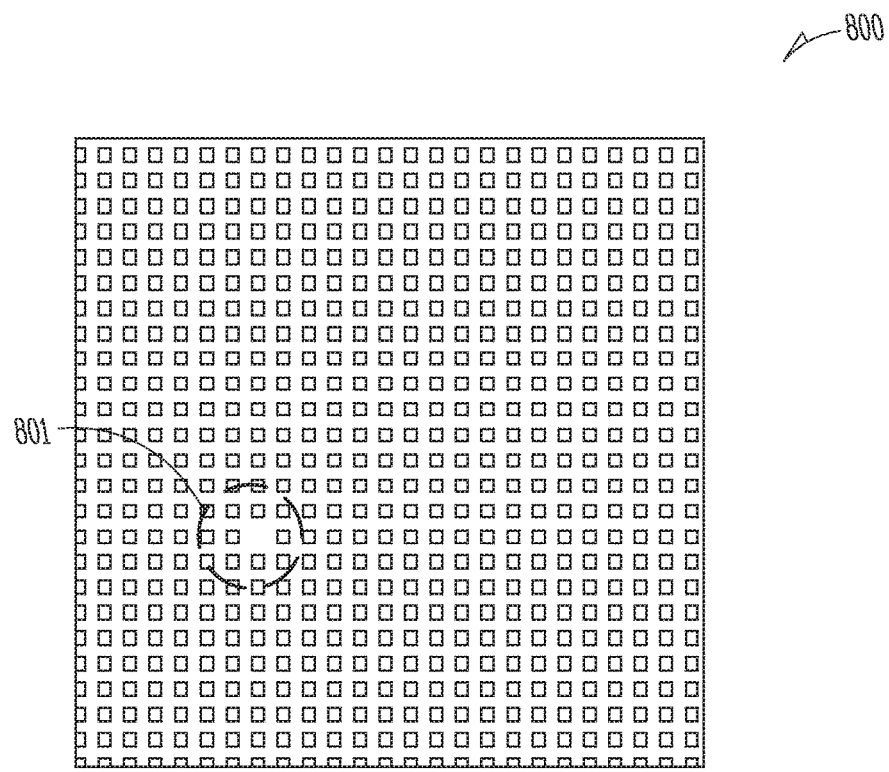
FIGS. 8A-8D show differences between initial tests with variable processing times and the number of iterative cycles.
Figure 8B:
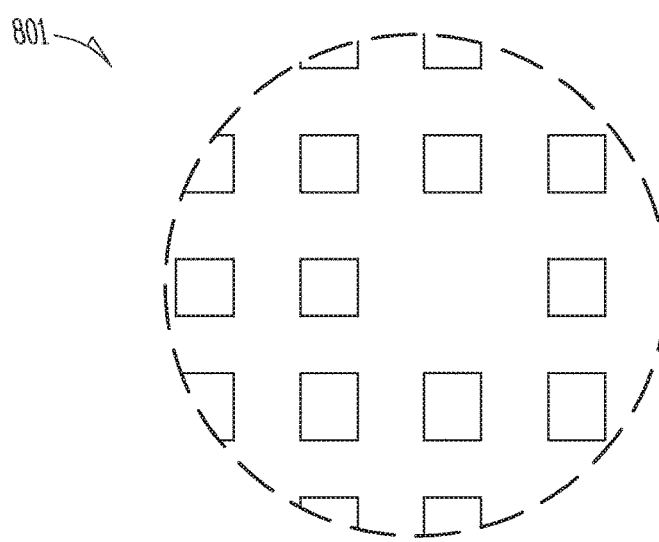

FIGS. 8A-8D show differences between initial tests with variable processing times and the number of iterative cycles. For example, FIG. 8A shows a top view 800 of memory cells etched for a longer period-of-time with a low number of cycles that resulted in visible residuals left in the contacts as noted within area 801. FIG. 8B shows an enlarged portion of the area 801, indicating that residuals were retained in at least one of the contacts. In this case, the vapor-etch cyclic process was run with an etch pressure of 40 mT with three cycles of 20 seconds each.

Figure 8C:
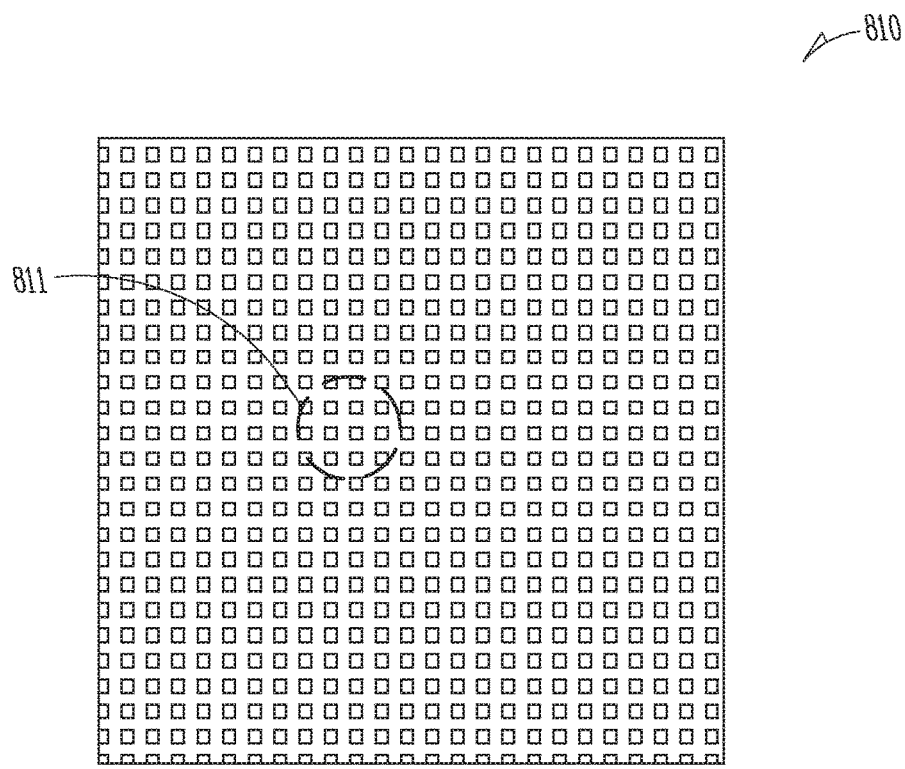
Figure 8D:
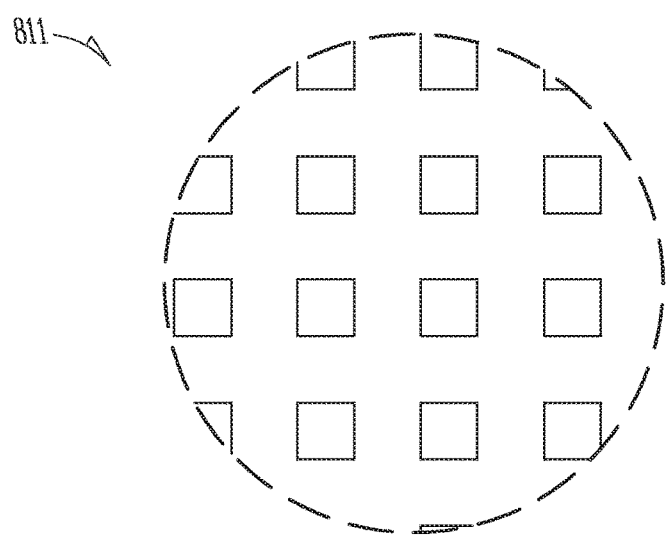

In contrast to FIG. 8A, FIG. 8C shows a top view 810 of memory cells etched for a shorter period-of-time than the memory cells of FIG. 8A with a higher number of cycles that resulted in no residuals left in the contacts as noted within area 811. FIG. 8D shows an enlarged portion of the area 811, indicating that no residuals were retained in any of the contacts. In this case, the vapor-etch cyclic process was run with an etch pressure of 40 mT, but with six cycles of 10 seconds each. FIGS. 8A-8D confirm that an increased number of cycles, at a lower time per cycle, yield better results for this particular device configuration. Although not confirmed experimentally, as the number of iterations increase significantly past 12 cycles, with reduced per cycle times, the oxide-to-nitride selectivity ratio is expected to increase further. Obviously, there are practical considerations to be considered as well. Consequently, a decrease in process time for a given cycle, coupled with increase in the number of cycles, reduced the amount of any residual significantly. As indicated by FIGS. 8C and 8D, the amount of residuals in individual cell contacts was clearly reduced with shortening the process time and increasing the number of cycles. Any remaining residuals are easily cleaned with, for example, very short 300:1 HF aqueous-based processes, which does not pose a problem for nitride loss.

Figure 9:
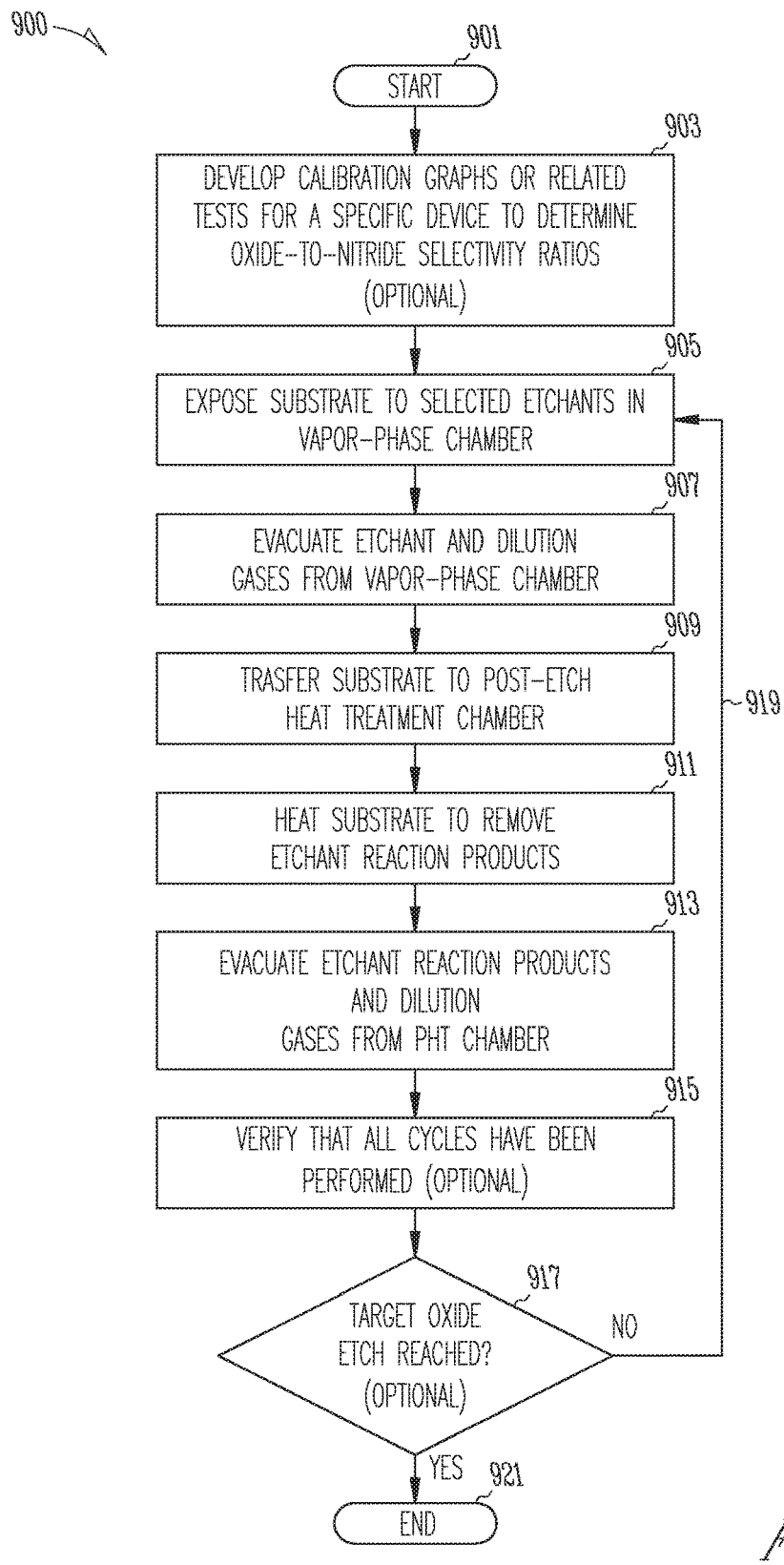
FIG. 9 shows an exemplary flow chart to implement the vapor-etch cyclic process method of the disclosed subject matter.

FIG. 9 shows an exemplary flow chart 900 to implement the vapor-etch cyclic process method of the disclosed subject matter. The flow chart 900 begins at operation 901. At optional operation 903, calibration graphs or related tests may be performed to determine oxide-to-nitride selectivity ratios. These graphs are developed in accordance with the detailed description provided herein. The graphs are developed for a particular device (e.g., a memory device or other electronic circuit) at a given design rule with specific geometrical considerations. The graphs may include, for example, the oxide-to-nitride selectivity ratio as a function of chamber temperature, chamber pressure, substrate temperature, etch times, a cycle (iteration) number, reactant gas and dilution gas flow rates, and other factors as discussed above.

With concurrent reference to FIGS. 2A and 2B, at operation 905, the substrate 209 is placed within the COR device 200 and exposed to selected etchant vapors (e.g., $NH_3$ and HF) for a predetermined amount of time. At operation 907, either concurrently with or following the substrate etch, all or substantially all of the etchant gases and dilution gases are then evacuated from the vapor-phase chamber 207.

At operation 909, the substrate 209 is removed from the COR device 200 and transferred to the post-etch heat treatment (PHT) device 230. At operation 911, the substrate is placed on the heater 233 within the PHT chamber 231 and heated to a predetermined temperature for a predetermined amount of time. At operation 913, either concurrently with or following the substrate heat treatment, all or substantially all of the reaction products and dilution gases are evacuated from the PHT chamber 231.

At operation 915, in an embodiment, an optional verification step is performed to as whether all predetermined cycles have been performed (e.g., 10 cycles). In other embodiments, the optional operation 915 is not performed. Instead, a determination is made at operation 917 whether the target oxide etch removal level has been reached. Various types of metrology tools known in the art may be used to make the oxide removal level determination. Critical dimension (CD) measurements can be used, in conjunction with the graphical processes discussed above, to determine an optimal process for a given device configuration. For example, the CD measurements can include measurements of a remaining RAD oxide "foot" (serving as an indicator of the effectiveness of RAD oxide removal), a nitride cap height (serving as an indicator of the process oxide-to-nitride selectivity ratio), and nitride spacer thicknesses (also an indicator of the process oxide-to-nitride selectivity ratio). Additionally, a cross-section CD SEM or TEM measurement may be determined by examining one or more of the devices from either an actual product substrate or a test substrate. If a determination is made that the target has been reached, the process ends at operation 921. Alternatively, if the target has not been reached as determined by operation 917, the process continues back to operation 905 to etch the substrate again. In other embodiments, operation 917 is not performed and the process ends at operation 921 once the number of determined cycles has been performed. If operation 917 is not performed, and if all cycles have not been completed as determined by operation 915, then the process continues back to operation 905 to etch the substrate again. In various embodiments, the oxide-to-nitride selectivity ratio may be predetermined to approximate a number of iterations expected for the vapor-etch cyclic process prior to beginning the method.

A person of ordinary skill in the art will appreciate that, for this and other methods (e.g., use of the disclosed vapor-etch cyclic process on other types of electronic devices) disclosed herein, that, unless indicated otherwise, the activities forming part of various methods may be implemented in a differing order, as well as repeated, executed simultaneously, or with various elements substituted one for another. Further, the outlined acts and operations are only provided as examples, and some of the acts and operations may be optional, combined into fewer acts and operations, or expanded into additional acts and operations without detracting from the essence of the disclosed embodiments.

Figure 10B:
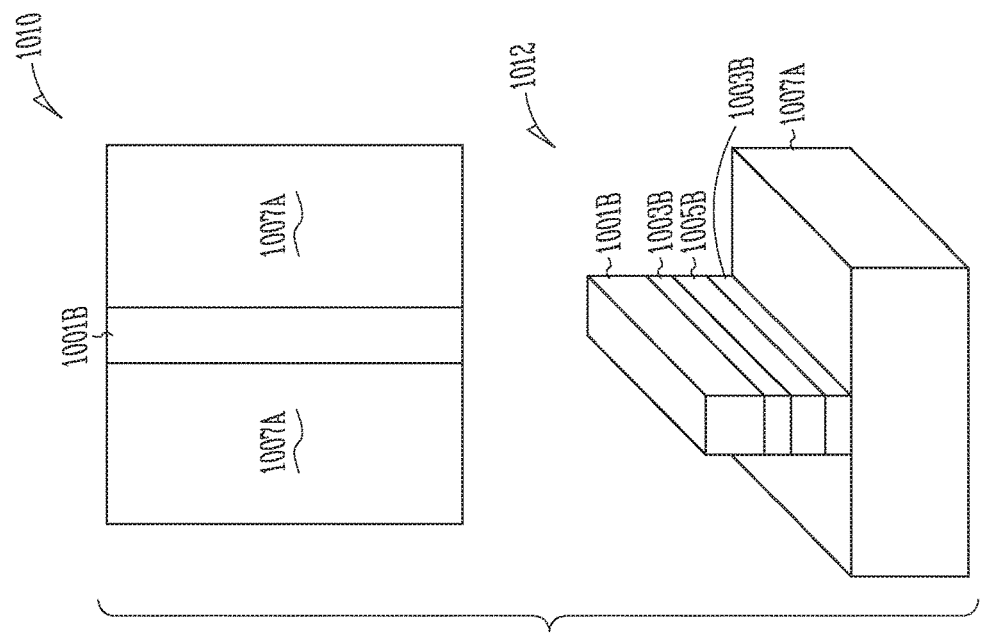
FIGS. 10A-10F show an exemplary application of the vapor-etch cyclic process of the disclosed subject matter in forming a horizontal Gate-All-Around (GAA) transistor.
Figure 10A:
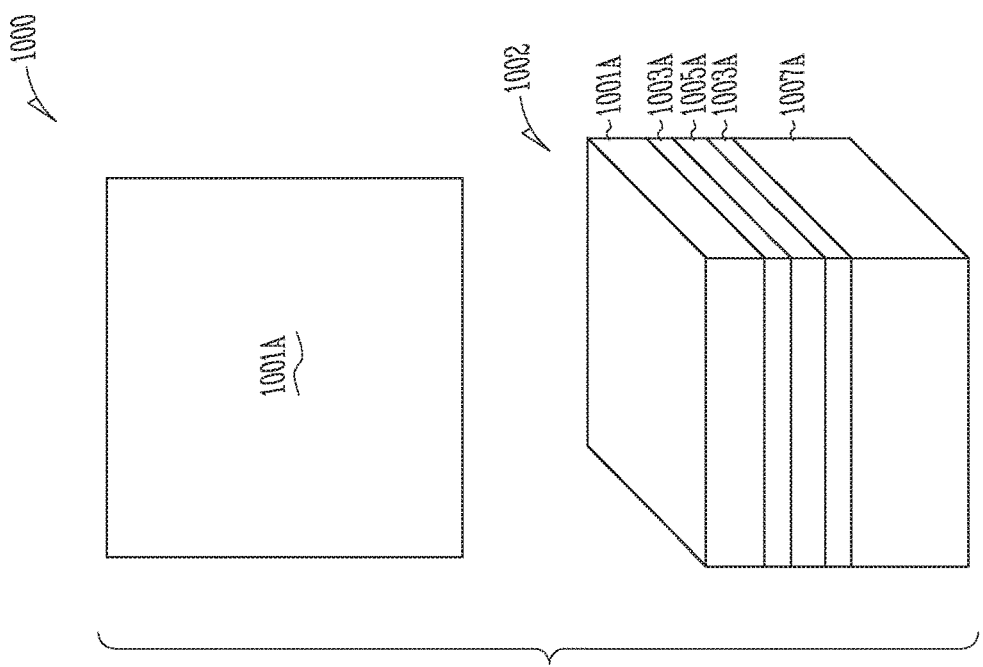
Figure 10D:
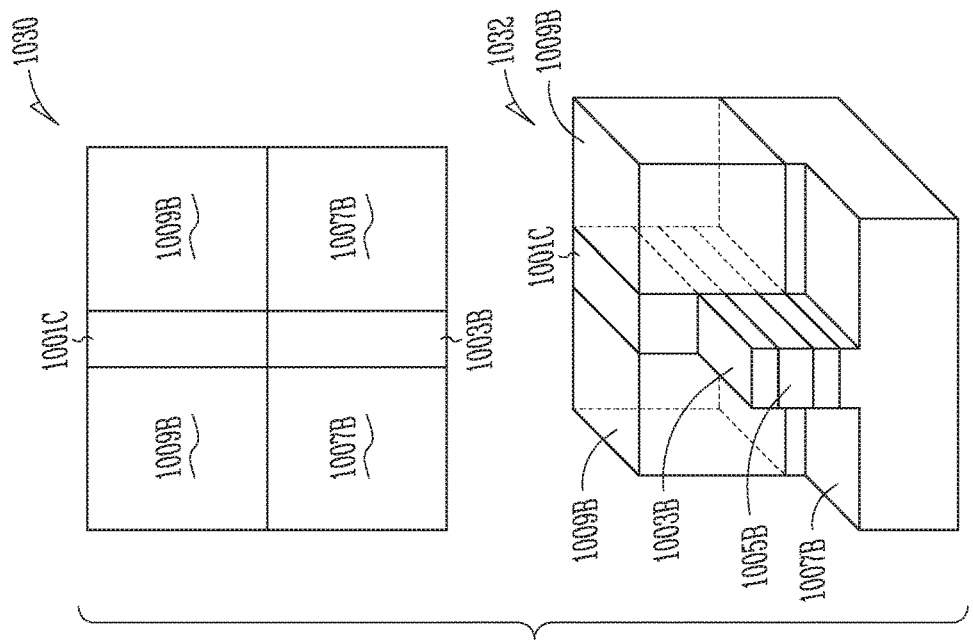
Figure 10C:
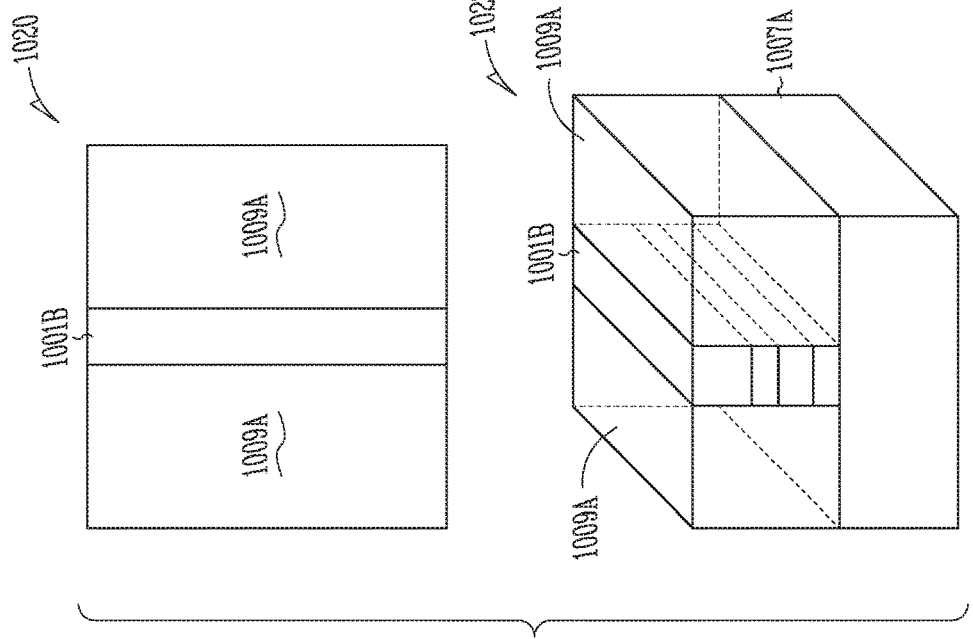
Figure 10F:
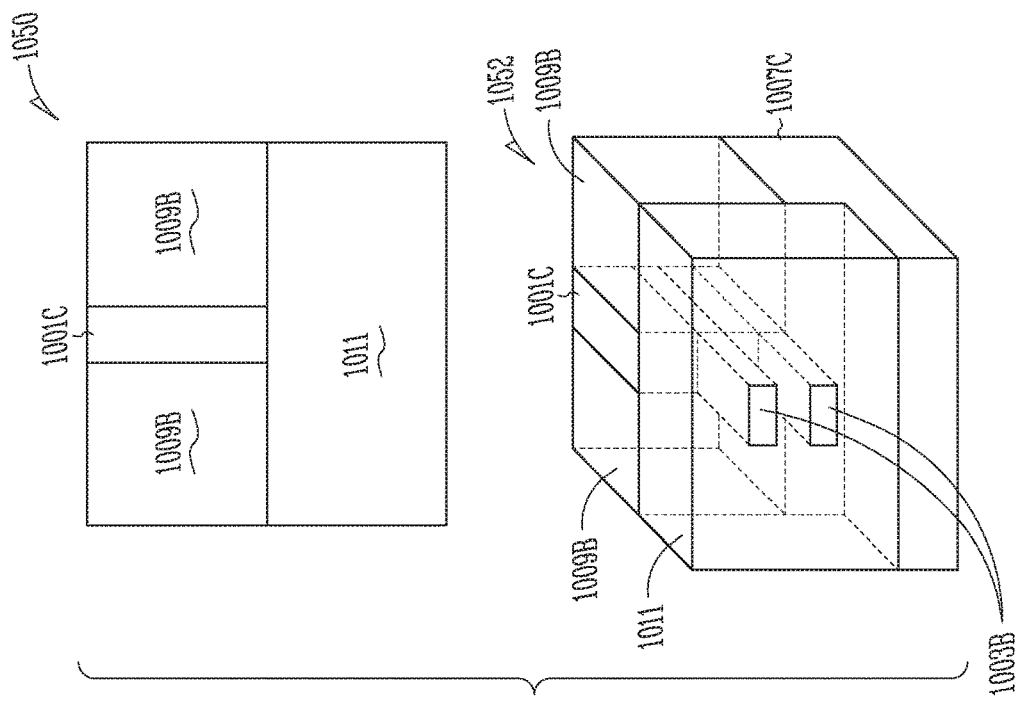

With reference now to FIGS. 10-10F, an exemplary application of the vapor-etch cyclic process of the disclosed subject matter (e.g., as disclosed above and by FIG. 9) is shown for forming a horizontal Gate-All-Around (GAA) transistor. Such a GAA transistor device is known in the art. However, formation of a GAA transistor by the techniques and methods disclosed herein is new and novel.

FIG. 10A is shown to include a plan view 1000 and a three-dimensional (3D) view 1002 of a channel stack used in the GAA transistor device. The 3D view 1002 is shown to include, from an uppermost level of the portion shown, a first dielectric level 1001A, a first semiconductor level 1003A, a second dielectric level 1005A, a second semiconductor level 1003A, and a third dielectric level 1007A. In various embodiments, each of the dielectric levels may be comprised of any of the dielectric materials described herein. Additionally, the semiconductor levels may be comprised of any of the semiconductor materials (e.g., elemental or compound) described herein. In a specific exemplary embodiment, the second dielectric level 1005A and the third dielectric level 1007A may be comprised of an oxide (of one or more types) and the first dielectric level 1001A may be comprised of a material different from either the second or third dielectric levels. For example, the first dielectric level 1001A may be formed from a material having different etch characteristics from either the second or third dielectric levels. In various embodiments, the first dielectric level 1001A may be comprised of silicon nitride ($Si_3N_4$) and the second dielectric level 1005A and the third dielectric level 1007A may each comprise $SiO_2$. In various embodiments, each the two semiconductor levels may comprise a different semiconductor material. In a specific exemplary embodiment, the semiconductor levels 1003A each may comprise, for example, silicon.

Referring now to FIG. 10B, a plan view 1010 and a three-dimensional (3D) view 1012 of the channel stack is shown. Top layers of the channel stack have been patterned and etched to begin forming multiple channels from the first and second semiconductor levels 1003A of FIG. 10A. FIG. 10B is shown to include an etched first dielectric level 1001B, etched first and second semiconductor levels 1003B, and an etched second dielectric level 1005B. Techniques for patterning and etching various levels are well-known in the art. Also, although not shown in FIG. 10B, a portion of an uppermost surface of the third dielectric level 1007A may also be etched.

In FIG. 10C, a plan view 1020 and a three-dimensional (3D) view 1032 of the channel stack is shown after further processing. A fourth dielectric material 1009A is deposited or otherwise formed to surround the patterned and etched materials of FIG. 10B. The fourth dielectric material 1009A may be comprised of one or more of the various dielectric materials described herein. However, in various embodiments, the fourth dielectric material 1009A is comprised of a material with different etch characteristics than the material comprising the first dielectric material 1001B. For example, in one specific exemplary embodiment, the fourth dielectric material 1009A is comprised of $SiO_2$. The skilled artisan will recognize that many other types of dielectric material or materials can be used as well. Once the fourth dielectric material 1009A is formed, a chemical-mechanical planarization (CMP) step may be performed to planarize an uppermost portion of the stack of FIG. 10C.

In FIG. 10D, a plan view 1030 and a three-dimensional (3D) view 1032 of the channel stack is shown. The fourth dielectric material 1009A of FIG. 10C has been partially etched by, for example, a patterning and etching process to form an etched fourth dielectric level 1009B. The patterning and etching process is also used to remove a portion of the etched first dielectric level 1001B of FIG. 10C that overlays the first semiconductor level 1003B, thereby forming a further etched first dielectric level 1001O. The patterning and etching process also etches at least an uppermost portion of the third dielectric level as well, forming an etched version of the third dielectric level 1007B.

Figure 10E:
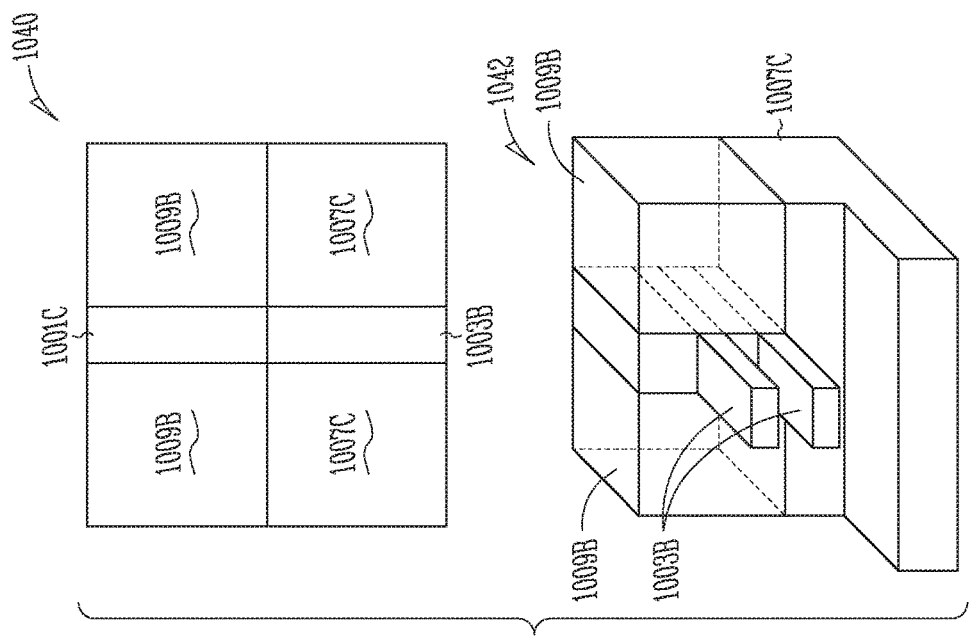

Referring to FIG. 10E, a plan view 1040 and a three-dimensional (3D) view 1042 is shown where the vapor-etch cyclic process described by the exemplary flow chart of FIG. 9 and as otherwise disclosed herein has been employed to remove remaining portions of the etched second dielectric level 1005B of FIG. 10D that are not at least partially surrounded by the etched fourth dielectric level 1009B. Additionally, a portion of the etched version of the third dielectric level 1007B of FIG. 10D, that formerly was immediately below the etched second semiconductor level 1003B, has been etched by the vapor-etch cyclic process, thereby forming a further etched version of the third dielectric 1007C.

In FIG. 10F, a plan view 1050 and a three-dimensional (3D) view 1052 shows that exposed portions of the etched first and second semiconductor levels 1003B have been enclosed by a gate dielectric 1011 formed around channels formed by the semiconductor levels. As is known to a person of ordinary skill in the art, the gate dielectric 1011 fully wraps around the formed channels to increase control of the current flow therein during operation of the GAA transistor device.

As mentioned above, the disclosed subject matter may be employed in other semiconductor device fabrication sequences, or even in the fabrication sequences of allied industries such as flat panel displays, optical recording substrates, thin film head development, as well as a variety of other substrate types known in various arts. For example, in memory and other device types, various types of oxide materials, such as tantalum pentoxide ($Ta_2O_5$), aluminum oxide ($Al_2O_3$), hafnium oxide ($HfO_2$), or a variety of other dielectric or ceramic materials may be used as an alternative to or in conjunction with silicon dioxide in its various forms discussed herein.

The present disclosure is therefore not to be limited in terms of the particular exemplary embodiments described in this application, which are merely intended as illustrations of various aspects. Many modifications and variations can be made, as will be apparent to a person of ordinary skill in the art upon reading and understanding the disclosure provided herein. Functionally equivalent methods and apparatuses within the scope of the disclosure, in addition to those enumerated herein, will be apparent to a person of ordinary skill in the art from the foregoing descriptions. Portions and features of some embodiments may be included in, or substituted for, those of others. Many other embodiments will be apparent to those of ordinary skill in the art upon reading and understanding the description provided herein. Such modifications and variations are intended to fall within a scope of the appended claims. The present disclosure is therefore to be limited only by the terms of the appended claims, along with the full scope of equivalents to which such claims are entitled. It is also to be understood that the terminology used herein is for the purpose of describing particular embodiments only and is not intended to be limiting.

Moreover, as used herein, the term "or" may be construed in an inclusive or exclusive sense unless otherwise explicitly noted or operationally defined. Additionally, although various exemplary embodiments described above focus on various general and specific exemplary embodiments, the embodiments are merely given for clarity in disclosure, and thus, are not limited to a particular type or design of a DRAM device, or even to memory devices in general. Moreover, as used herein, the term "exemplary" refers to one example or a set of examples only, and should not necessarily be construed as the preferred or best way to implement portions of the disclosed subject matter.

The Abstract of the Disclosure is provided to allow the reader to quickly ascertain the nature of the technical disclosure. The abstract is submitted with the understanding that it will not be used to interpret or limit the claims. In addition, in the foregoing Detailed Description, it may be seen that various features or operations are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A method of selectively etching oxides over nitrides in a vapor-etch cyclic process, the method comprising:
   in a first portion of the vapor-etch cyclic process:
   exposing a substrate having oxide features and nitride features formed thereon to selected etchants in a vapor-phase chamber under conditions to etch the oxide features with selectively relative to the nitride features;
   transferring the substrate to a post-etch heat treatment chamber; and
   heating the substrate to remove etchant reaction products from the substrate; and
   in a second portion of the vapor-etch cyclic process:
   transferring the substrate from the post-etch heat treatment chamber to the vapor-phase chamber;
   exposing the substrate to the selected etchants in the vapor-phase chamber under conditions to etch the oxide features with selectively relative to the nitride features;
   transferring the substrate to the post-etch heat treatment chamber; and
   heating the substrate to remove additional etchant reaction products from the substrate.

2. The method of claim 1, wherein a first of the selected etchants is ammonia ($NH_3$).

3. The method of claim 1, wherein a second of the selected etchants is hydrogen fluoride (HF).

4. The method of claim 1, further comprising mixing the selected etchants in a gas mixing chamber prior to the selected etchants entering the vapor-phase chamber.

5. The method of claim 1, wherein a volumetric gas flow rate of the selected etchants entering the vapor-phase chamber is from about 30 sccm to about 100 sccm.

6. The method of claim 1, wherein a pressure in the vapor-phase chamber Is maintained within a range from about 20 mT to about 200 mT.

7. The method of claim 1, wherein a pressure in the vapor-phase chamber Is maintained at about 40 mT.

8. The method of claim 1, wherein a stage in the vapor-phase chamber on which the substrate is placed is maintained within a temperature range from about 20° C. to about 80° C.

9. The method of claim 1, wherein a stage in the vapor-phase chamber on which the substrate is placed is maintained within a temperature range from about 25° C. to about 45° C.

10. The method of claim 1, wherein an average time of the substrate in the vapor-phase chamber during the first portion of the process varies within a range from about 4 seconds to about 20 seconds.

11. The method of claim 1, wherein a pressure in the post-etch heat treatment chamber is maintained in a range from about 100 mT to about 3000 mT.

12. The method of claim 1, wherein a stage in the post-etch heat treatment chamber on which the substrate is placed is maintained within a temperature range from about 100° C. to about 300° C.

13. The method of claim 1, wherein an average time of the substrate in the post-etch heat treatment chamber during the second portion of the process varies within a range from about 30 seconds to about 150 seconds.

14. The method of claim 1, wherein etching of the substrate occurs in a non-plasma-based reaction.

15. A method of selectively etching oxides over nitrides in a vapor-etch cyclic process, the method comprising:
    determining a number of cycles in the vapor-etch cyclic process, the number of cycles being at least two iterations of a substrate including oxide features and nitride features being exposed to etchants in a vapor-phase chamber followed by being heated in a post-etch heat treatment process, the substrate having oxide features and nitride features formed thereon;
    exposing the substrate to ammonia ($NH_3$) and hydrogen fluoride (HF) etchants in the vapor-phase chamber in a first portion of the vapor-etch cyclic process under conditions to etch the oxide features with a threshold degree of selectively relative to the nitride features;
    heating the substrate to remove etchant reaction products from the substrate in a second portion of the vapor-etch cyclic process; and
    repeating the first portion and the second portion of the vapor-etch cyclic process for a remainder of the determined number of cycles.

16. The method of claim 15, further comprising evacuating substantially all etchant gases from the vapor-phase chamber prior to beginning the post-etch heat treatment process.

17. The method of claim 15, further comprising evacuating substantially all etchant reaction products from the vapor-phase chamber prior to beginning additional operations of exposing the substrate to the ammonia ($NH_3$) and the hydrogen fluoride (HF) etchants.

18. The method of claim 15, wherein the first portion and the second portion of the vapor-etch cyclic process are performed in a single vapor-phase chamber.

19. The method of claim 15, wherein the oxide features and the nitride features formed on the substrate define a portion of a DRAM memory cell.

20. A method of selectively etching oxides over nitrides in a vapor-etch cyclic process, the method comprising:
    exposing a substrate having oxide features and nitride features formed thereon to selected etchants in a first portion of the vapor-etch cyclic process; and
    heating the substrate to remove etchant reaction products from the substrate in a second portion of the vapor-etch cyclic process;
    wherein oxide features are etched relative to the nitride features at a selectively of at least 50:1.

21. The method of claim 20, further comprising:
    determining whether a target oxide etch level has been reached; and
    repeating the first portion and the second portion of the vapor-etch cyclic process for at least one additional cycle until the target oxide etch level is reached.

22. The method of claim 21, further comprising predetermining an oxide-to-nitride selectivity ratio of the vapor-etch cyclic process prior to performing the method to approximate a number of iterations expected for repeating the first portion and the second portion of the vapor-etch cyclic process.

23. The method of claim 21, further comprising:
    determining an amount of oxide etch per each cycle of the vapor-etch cyclic process; and
    determining an expected number of iterations expected for repeating the first portion and the second portion of the vapor-etch cyclic process.

24. A method of selectively etching oxides over nitrides in a vapor-etch cyclic process, the method comprising:
    exposing a substrate to ammonia ($NH_3$) and hydrogen fluoride (HF) etchants in a vapor-phase chamber in a first portion of the vapor-etch cyclic process for a period of between 4 and 20 seconds, the substrate having exposed oxide features and nitride features formed thereon;
    heating the substrate to remove etchant reaction products from the substrate in a second portion of the vapor-etch cyclic process; and
    repeating the first portion and the second portion of the vapor-etch cyclic process at least once;
    wherein the oxide features are etched with selectively of at least 50:1 relative to the nitride features.

25. The method of claim 24, further comprising determining whether a target oxide etch level has been reached.

26. The method of claim 25, further comprising:
    based on a determination that the target oxide etch level has been reached, ending the vapor-etch cyclic process; and
    based on a determination that the target oxide level has not been reached:
        exposing the substrate in a further iteration to the ammonia ($NH_3$) and hydrogen fluoride (HF) etchants in the vapor-phase chamber; and
        heating the substrate to remove additional etchant reaction products from the substrate.

* * * * *